United States Patent [19]

Imamura

[11] Patent Number: 5,336,632
[45] Date of Patent: Aug. 9, 1994

[54] METHOD FOR MANUFACTURING CAPACITOR AND BIPOLAR TRANSISTOR

[75] Inventor: Hironobu Imamura, Tokyo, Japan

[73] Assignee: NEC Corporation, Tokyo, Japan

[21] Appl. No.: 96,987

[22] Filed: Jul. 27, 1993

[30] Foreign Application Priority Data

Jul. 27, 1992 [JP] Japan ................................. 4-199339

[51] Int. Cl.⁵ .............................................. H01L 21/70
[52] U.S. Cl. ........................................ 437/60; 437/31; 437/919
[58] Field of Search ................... 437/47, 52, 60, 919, 437/31; 257/532, 533

[56] References Cited

U.S. PATENT DOCUMENTS

| | | | |
|---|---|---|---|
| 4,805,071 | 2/1989 | Hutter et al. | 437/60 |
| 4,939,099 | 7/1990 | Seacrist et al. | 437/47 |
| 4,994,887 | 2/1991 | Hutter et al. | 351/43 |
| 5,013,678 | 5/1991 | Winnerl et al. | 437/60 |

*Primary Examiner*—Tom Thomas
*Attorney, Agent, or Firm*—Sughrue, Mion, Zinn, Macpeak & Seas

[57] ABSTRACT

A lower electrode of a capacitor is manufactured simultaneously with an electrode such as a collector electrode and a base electrode of a bipolar transistor, and an upper electrode of the capacitor is manufactured simultaneously with another electrode such as an emitter electrode of the bipolar transistor. A dielectric layer between the lower and upper electrodes is manufactured simultaneously with other insulating layers of the bipolar transistor.

8 Claims, 12 Drawing Sheets

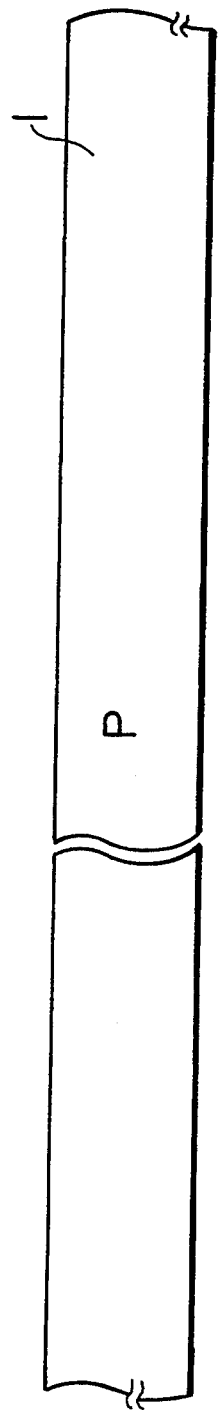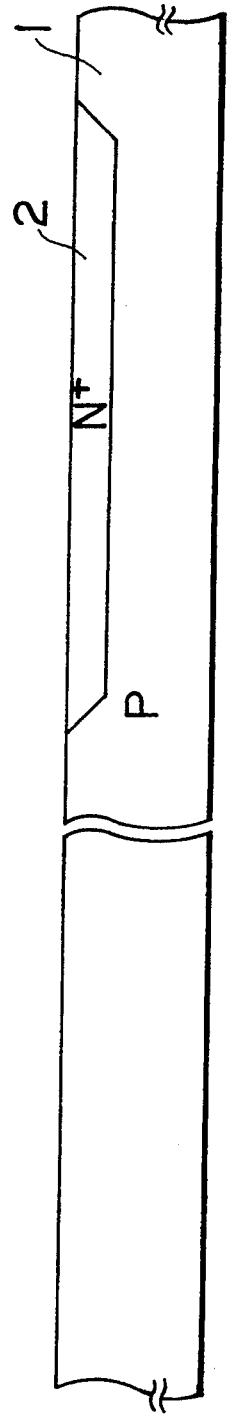

METHOD FOR MANUFACTURING CAPACITOR AND BIPOLAR TRANSISTOR

BACKGROUND OF THE INVENTION

1. Field of the Invention

The present invention relates to a method for manufacturing a semiconductor device, and more particularly, to a method for manufacturing a capacitor and a bipolar transistor on the same semiconductor substrate.

2. Description of the Related Art

Generally, in a semiconductor device, a capacitor including lower and upper electrodes and a dielectric layer therebetween is formed on a thick insulating layer (a so-called field insulating layer) which defines a field area, and a bipolar transistor is formed in an active area where no field insulating layer is formed.

In the prior art, the lower electrode of the capacitor is manufactured simultaneously with an electrode such as a base electrode of the bipolar transistor, and the upper electrode of the capacitor is manufactured simultaneously with an electrode such as a emitter electrode of the bipolar transistor. Conversely, the dielectric layer of the capacitor is manufactured independent of other insulating layers for the bipolar transistor. As a result, the number of manufacturing steps of a semiconductor device including a capacitor and a bipolar transistor are increased, thus increasing the manufacturing cost.

SUMMARY OF THE INVENTION

It is an object of the present invention to provide a method for manufacturing a semiconductor device including a capacitor and a bipolar transistor, which is low in cost.

According to the present invention, a lower electrode of a capacitor is manufactured simultaneously with an electrode such as a collector electrode and a base electrode of a bipolar transistor, and an upper electrode of the capacitor is manufactured simultaneously with another electrode such as an emitter electrode of the bipolar transistor. A dielectric layer between the lower and upper electrodes is manufactured simultaneously with other insulating layers of the bipolar transistor. As a result, the manufacturing steps are reduced, thus reducing the manufacturing cost.

BRIEF DESCRIPTION OF THE DRAWINGS

The present invention will be more clearly understood from the description as set forth below with reference to the accompanying drawings, wherein:

FIGS. 1 through 19 are cross-sectional views explaining a method for manufacturing a semiconductor device according to the present invention.

DESCRIPTION OF THE PREFERRED EMBODIMENT

As illustrated in FIG. 1, a P-type semiconductor substrate 1 is prepared, and as illustrated in FIG. 2, N+-type impurities such as phosphoruses (P) or arsenic (As) are doped into the semiconductor substrate 1, to create an N+-type impurity diffusion region 2 which will serve as a buried layer.

Figure 3:
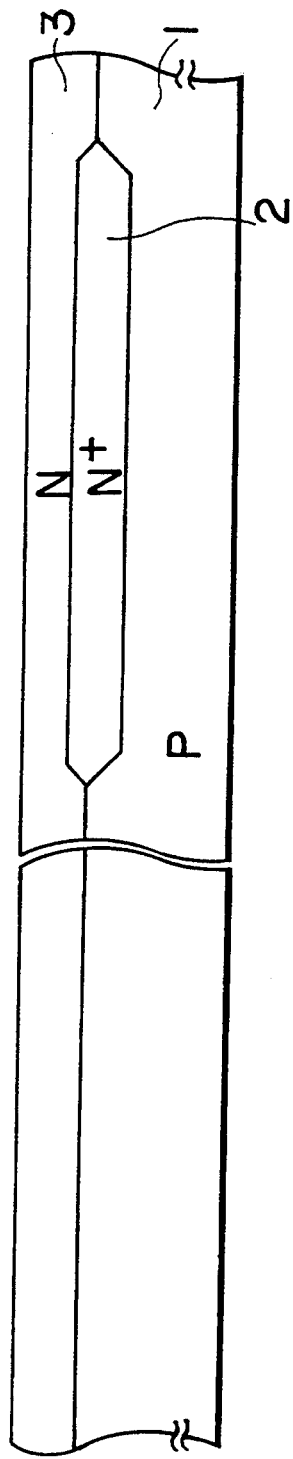

Next, as illustrated in FIG. 3, an N-type epitaxial layer 3 is grown on the surface. In this case, the N+-type impurity diffusion region 2 is grown into the N-type epitaxial layer 3.

Figure 4:
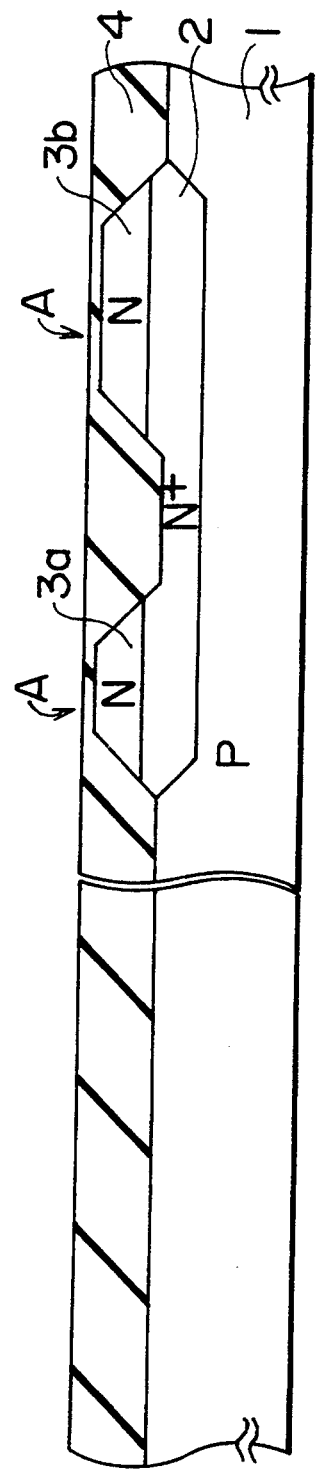

Next, as illustrated in FIG. 4, a thick silicon dioxide layer (i.e., a field insulating layer) 4 is formed by using the local oxidation of silicon (LOCOS). That is, first, a thin silicon dioxide layer and a thin silicon nitride layer formed on active areas as indicated by arrows A, and a thick silicon dioxide layer (not shown) is thermally grown with the silicon nitride mask. Then, the thick silicon dioxide layer is etched out, the thick silicon dioxide layer 4 is thermally grown with the silicon nitride mask. Then, the silicon nitride mask is etched out. Thus, the field insulating layer 4 is obtained by carrying out the LOCOS process twice. In this case, the N-type epitaxial layer 3 is divided by the field insulating layer 4 into an N-type epitaxial layer 3a for a collector region and an N-type epitaxial layer 3b for a base region and an emitter region.

Figure 5:
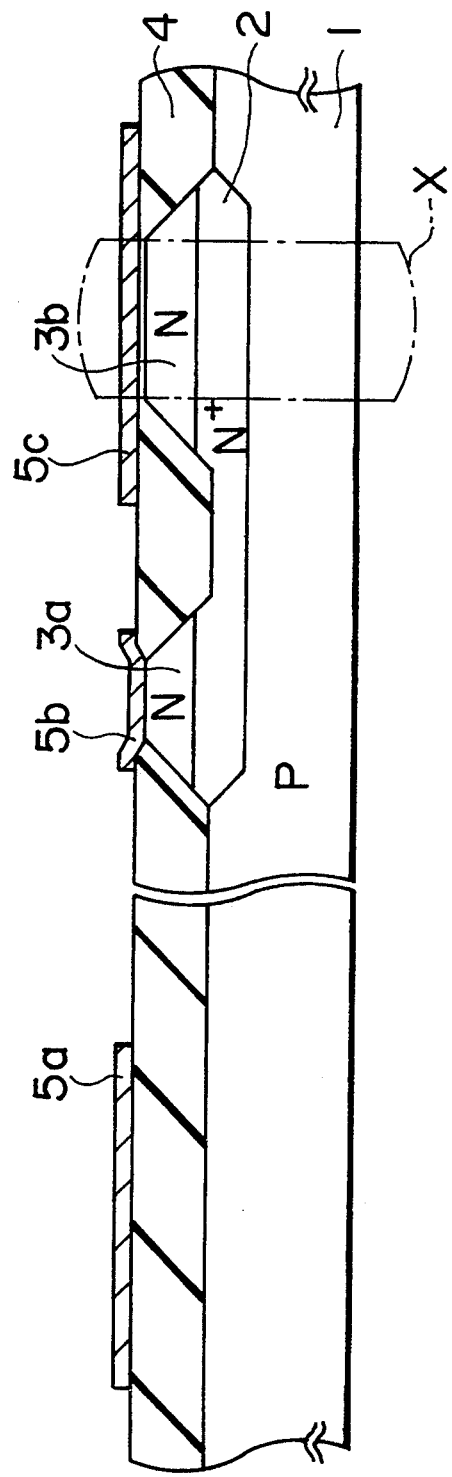

Next, as illustrated in FIG. 5, the thin insulating layer on the N-type epitaxial layer 3a is etched out. Then, a conductive layer 5 (not shown) made of polycrystalline silicon is deposited by CVD technology, and is patterned by conventional photolithography to obtain a conductive layer 5a serving as a capacitor lower electrode, a conductive layer 5b serving as a collector electrode, and a conductive layer 5c serving as a base electrode. Then, borons (B) are doped into the conductive layers 5a and 5c, while phosphoruses (P) are doped into the conductive layer 5b.

Figure 6:
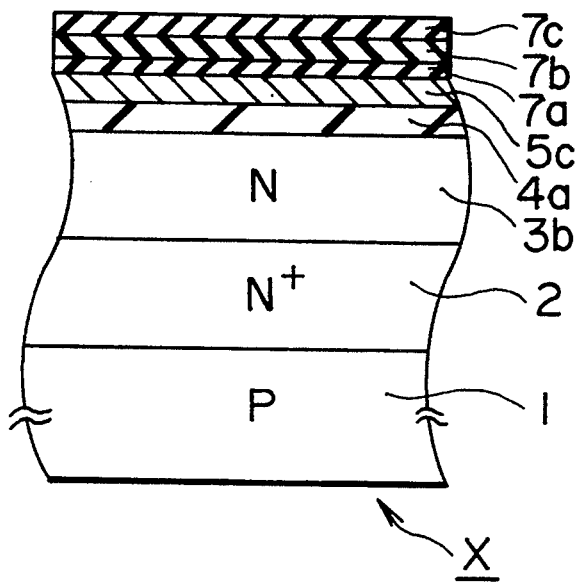

Next, as illustrated in FIG. 6 which illustrates only a portion X of FIG. 5, an insulating layer 7a made of silicon nitride having a thickness of about 110 nm, an insulating layer 7b made of silicon dioxide having a thickness of about 200 nm, and an insulating layer 7c made of silicon nitride having a thickness of about 150 nm are deposited by CVD technology.

Figure 7:
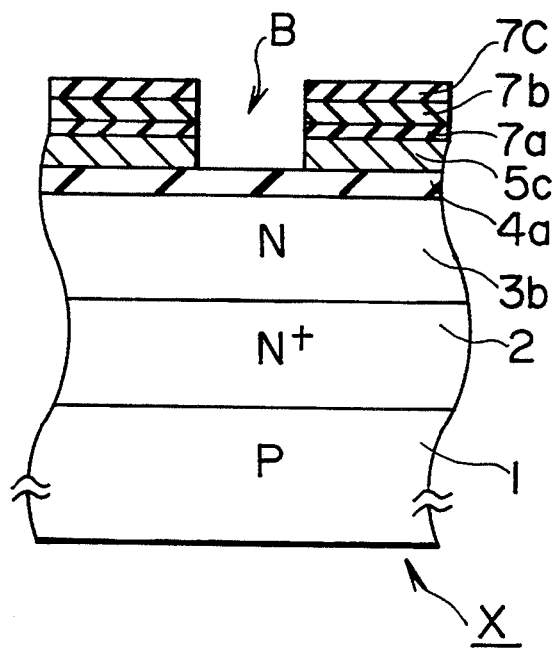

Next, as illustrated in FIG. 7, an ion etching operation is performed upon the three insulating layers 7a, 7b and 7c, and the conductive layer 5c, to thereby create an opening B.

Figure 8:
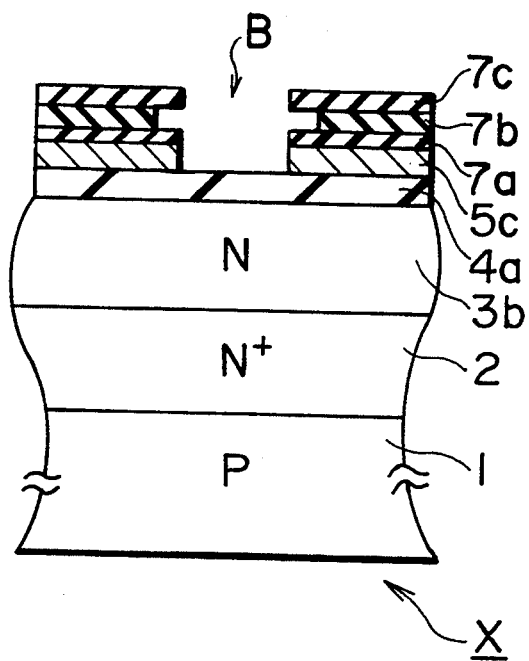

Next, as illustrated in FIG. 8, the insulating layer 7b which is, in this case, made of silicon dioxide is etched by hydrogen fluoride solution with the mask of the conductive layer (polycrystalline silicon) 5c and the insulating layers (silicon nitride) 7a and 7c. Thus, the side of insulating layers 7a, 7b and 7c is hollowed out.

Figure 9:
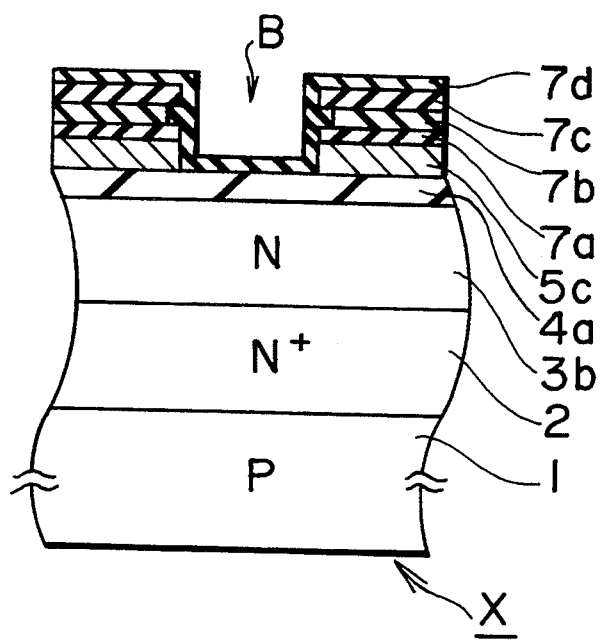

Next, as illustrated in FIG. 9, an insulating layer 7d made of silicon nitride having a thickness of about 110 nm is deposited by CVD technogy.

Figure 10:
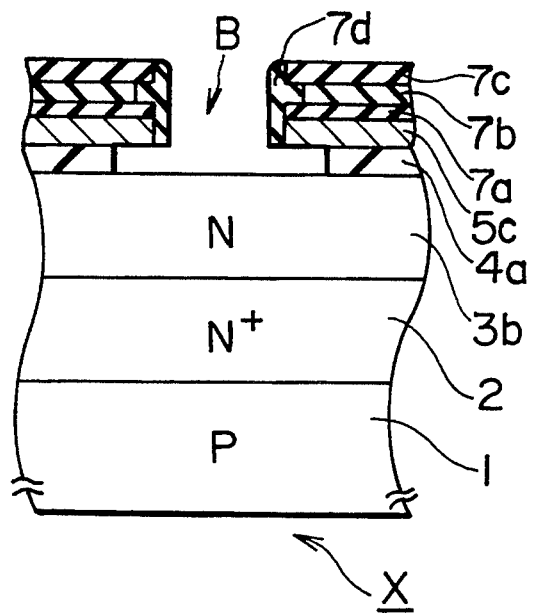

Next, as illustrated in FIG. 10, the insulating layer 7d is etched back to leave it as a sidewall spacer. Also, the insulating layer 4a is etched by a hydrogen fluoride solution. As a result, the surface of the N-type epitaxial layer 3b is exposed to the opening B, and the insulating layer 4a is hollowed out. In this case, since the sidewall spacer 7d is engaged in the hollowed portion of the insulating layers 7a, 7b and 7c, the sidewall spacer 7d is hardly separated therefrom.

Figure 11:
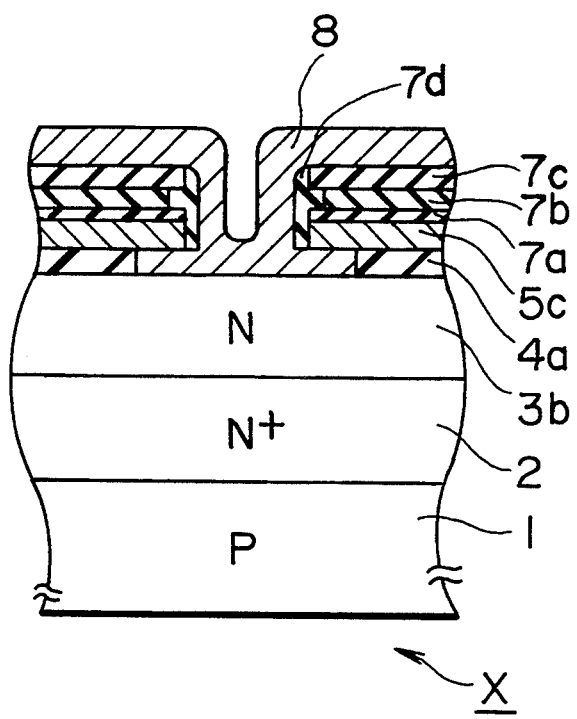

Next, as illustrated in FIG. 11, a polycrystalline silicon layer 8 is deposited by CVD technology, to fill it into the hollowed insulating layer 4a.

Figure 12:
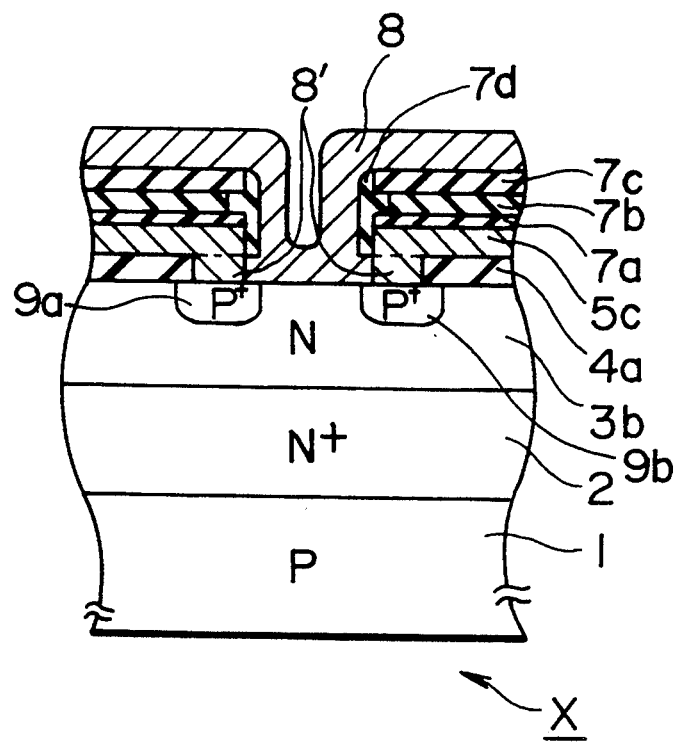

Next, as illustrated in FIG. 12, a heat operation is carried out to diffuse borons (B) from the boron-doped conductive layer 5c via the non-doped polycrystalline silicon layer 8 to the N-type epitaxial layer 3b. As a result, P+-type impurity diffusion regions 9a and 9b are formed within the N-type epitaxial layer 3b. In this case, borons (B) are diffused into the non-doped polycrystalline silicon layer 8 immediately beneath the boron-doped conductive layer 5c, so accordingly, portions 8' are of a P-type.

Figure 13:
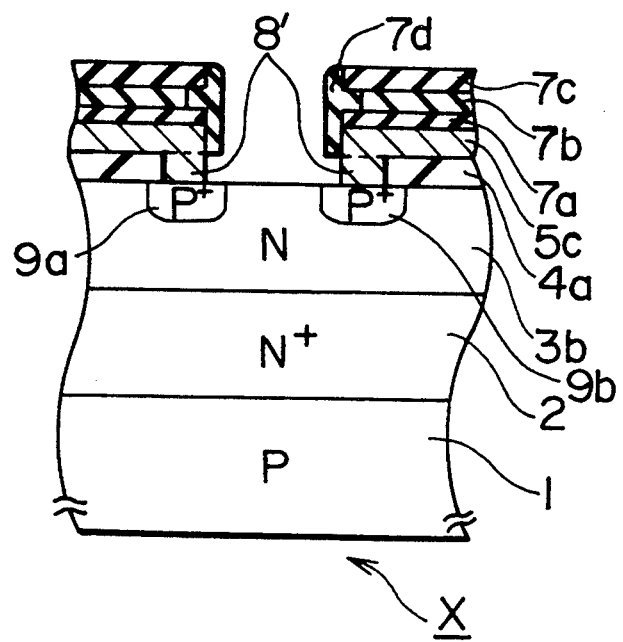

Next, as illustrated in FIG. 13, only the non-doped portion of the polycrystalline silicon layer 8 is etched. In this case, use is made of the difference in etching rate. That is, the etching rate of non-doped polycrystalline silicon by a silicon etching solution including hydrogen fluoride and nitric acid is greater than that of doped polycrystalline silicon by the same etching solution.

Figure 14:
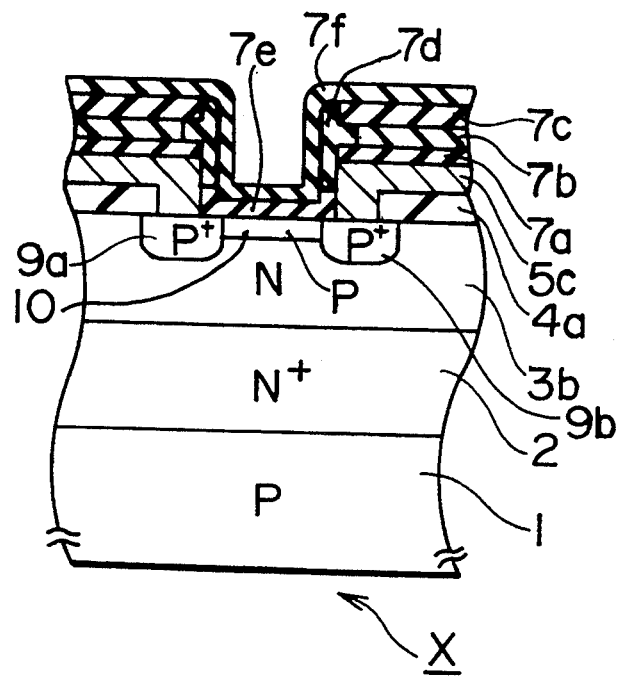

Next, as illustrated in FIG. 14, an insulating layer 7e made of silicon dioxide having a thickness of about 70 nm is thermally grown, and borons(B) are doped thereinto. Then, a heating operation is carried out, in other words, an indentation diffusion process is carried out, to create a P-type impurity diffusion region 10 immediately beneath the insulating layer 7e. Further, an insulating layer 7f made of silicon nitride having a thickness of about 150 nm is deposited by CVD technology. In this case, the P-type impurity diffusion region 10 serves as a base region, and the P+-type impurity diffusion regions 9a and 9b serve as graft base regions.

Figure 15:
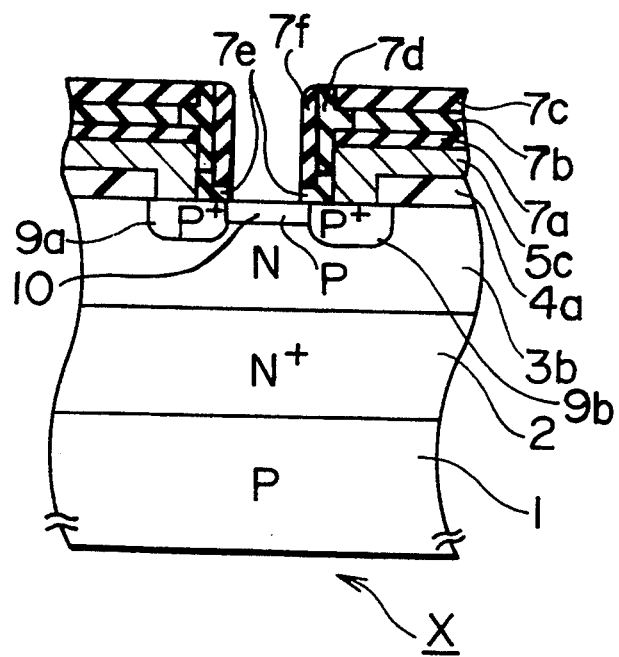

Next, as illustrated in FIG. 15, an anisotropic etching operation is performed upon the insulating layer (silicon nitride) 7f, to leave it as a sidewall spacer. Further, the portion of the insulating layer 7e surrounded by the sidewall spacer 7f is etched back; however, this etching operation is stopped to leave the portion of the insulating layer 7e at its both sides. In this case, some of the insulating layer 7e immediately on the P-type impurity region (base region) 10, which is about 20 nm thick, remains, to thereby avoid the contamination of the P-type impurity region 10, although such a portion is not shown.

Figure 16:
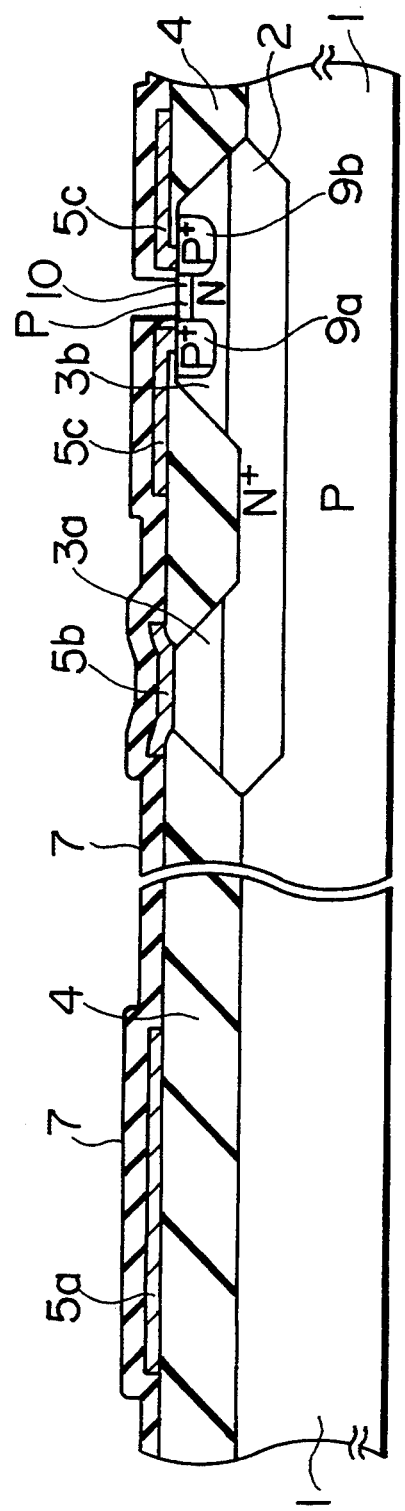

In this state, the entire configuration is illustrated in FIG. 16 in which reference numeral 7 designates a triple insulating layer formed by the insulating layers 7a, 7b and 7c.

Figure 17:
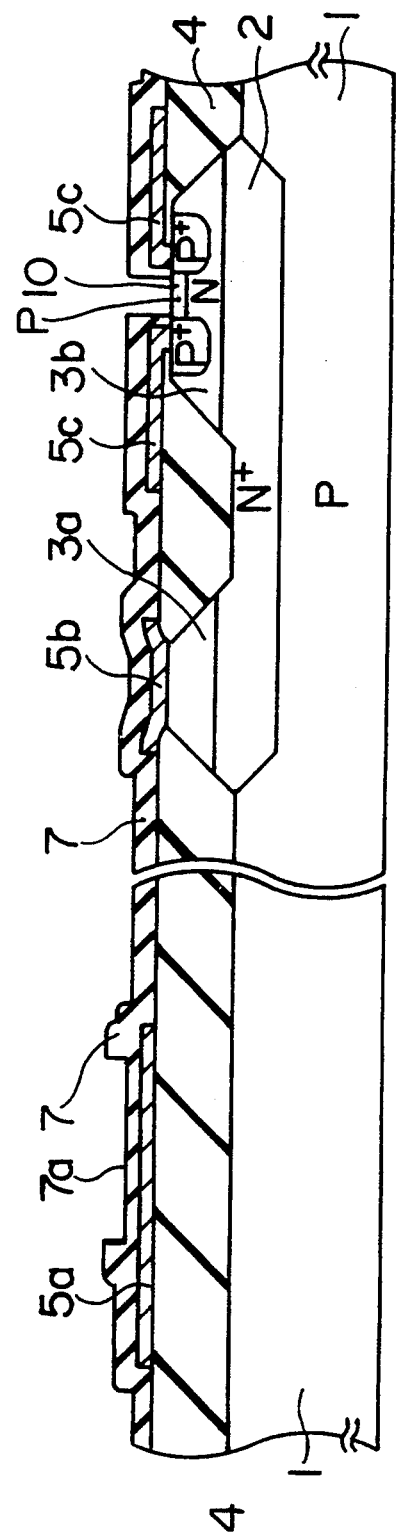

Next, as illustrated in FIG. 17, the insulating layer 7 on the conductive layer (capacitor lower electrode) 5a is partly removed. In more detail, the insulating layer (silicon nitride) 7c is partly etched by a CF4 gas, and the insulating layer (silicon dioxide) 7b is partly etched by a hydrogen fluoride solution with the mask of the insulating layer (silicon nitride) 7c. As a result, only the insulating layer (silicon nitride) 7a remains on the conductive layer 5a.

Figure 18:
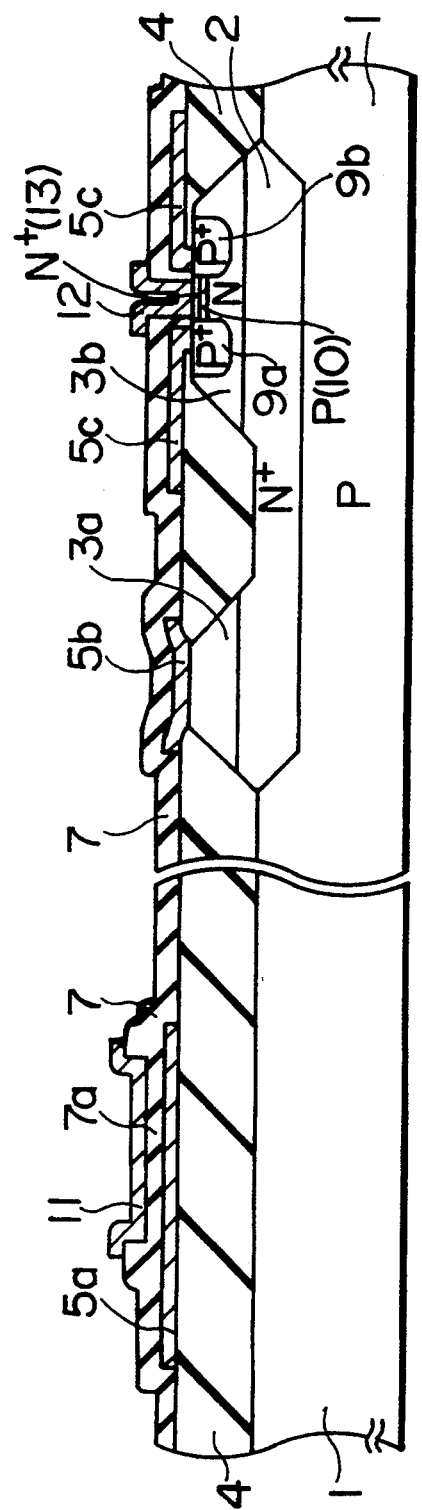

Next, as illustrated in FIG. 18, a polycrystalline silicon layer is deposited by CVD technology, and arsenic (As) are doped thereinto. Then, the polycrystalline silicon layer is patterned by photolithography, to obtain a conductive layer 11 serving as a capacitor upper electrode and a conductive layer 12 serving as an emitter electrode.

Figure 19:
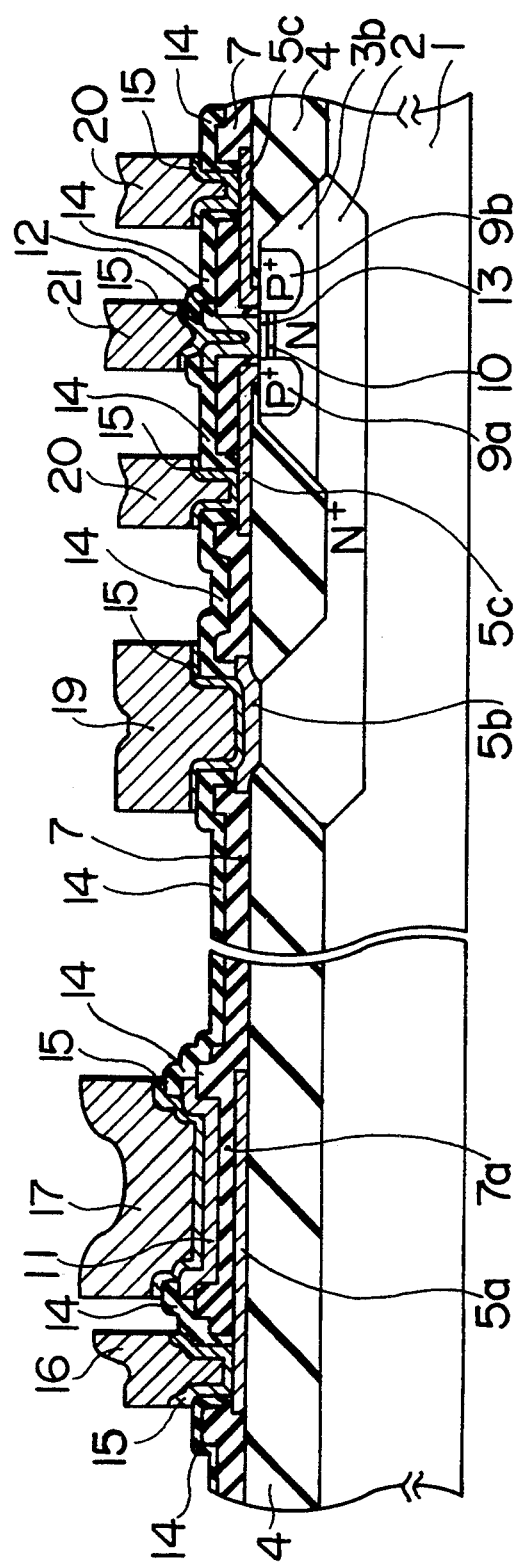

Next, as illustrated in FIG. 19, a passivation layer 14 is deposited by CVD technology, and contact holes for the capacitor lower electrode 5a, the capacitor upper electrode 11, the collector electrode 5b, the base electrodes 5c and the emitter electrode 12 are made in the passivation layer 14. Further, a heating operation is carried out to diffuse the arsenic (As) of the conductive layer 12 to the P-type impurity region 10. As a result, an N+-type emitter region 13 is generated within the P-type impurity region 10. Then, barrier metal layers 15 are formed in the contact holes. Finally, a capacitor lower electrode connection 16, a capacitor upper electrode connection 17, a collector electrode connection 19, base electrode connections 20 and an emitter electrode connection 21 are formed, thus completing the device.

As explained hereinbefore, according to the present invention, since a capacitor dielectric layer uses a part of insulating layers used in formation of a bipolar transistor, the number of manufacturing steps are reduced to reduce the manufacturing cost.

I claim:

1. A method for manufacturing a capacitor and a bipolar transistor by using a semiconductor substrate including a capacitor forming area and a bipolar transistor forming area, comprising the steps of:

forming a first insulating layer on the capacitor forming area of said semiconductor substrate;

forming a capacitor lower electrode on said first insulating layer and, at least one of first and second electrodes of said bipolar transistor on the bipolar transistor forming area of said semiconductor substrate;

forming a plurality of second insulating layers on said capacitor lower electrode and said first electrode;

removing at least one of said plurality of second insulating layers on said capacitor lower electrode to form a capacitor dielectric layer by the remainder of said plurality of second insulating layers; and forming a capacitor upper electrode on said capacitor dielectric layer and a third electrode of said bipolar transistor on the bipolar transistor forming area of said semiconductor substrate.

2. A method as set forth in claim 1, wherein said plurality of second insulating layers comprises a first silicon nitride layer, a silicon dioxide layer and a second silicon nitride layer in this order, said removing step comprising a step of removing said silicon dioxide layer and said second silicon nitride layer.

3. A method as set forth in claim 1, wherein said first, second and third electrodes are a collector electrode, a base electrode and an emitter electrode, respectively.

4. A method for manufacturing a capacitor and a bipolar transistor by using a semiconductor substrate including a capacitor forming area and a bipolar transistor forming area, comprising the steps of:

forming a first insulating layer on the capacitor forming area of said semiconductor substrate;

forming a second insulating layer on the bipolar transistor forming area of said semiconductor substrate;

forming a capacitor lower electrode on said first insulating layer, a collector electrode of said bipolar transistor on the bipolar transistor forming area of said semiconductor substrate, and a base electrode of said bipolar transistor on said second insulating layer;

forming third, fourth and fifth insulating layers in this order;

selectively removing said third fourth and fifth insulating layers to expose a part of said base electrode;

removing the exposed part of said base electrode;

forming a graft base region, within said semiconductor substrate, connected to said base electrode;

forming a base region, within said semiconductor substrate, connected to said graft base region;

selectively removing said fourth and fifth insulating layers on said capacitor lower electrode to form a capacitor dielectrode layer by said second insulating layer; and forming a capacitor upper electrode on said capacitor dielectric layer and an emitter electrode of said bipolar transistor on the removed part of said base electrode.

5. A method as set forth in claim 4, wherein said third, fourth and fifth insulating layers comprise a first silicon nitride layer, a silicon dioxide layer and a second silicon nitride layer, respectively.

6. A method as set forth in claim 4, wherein said graft base region forming step comprises the steps of:
   doping impurities into said base electrode;
   forming a sidewall spacer covering a side of said third, fourth and fifth insulating layers at the removed portions thereof and a side of said base electrode at the removed portion thereof;
   removing a part of said second insulating layer with a mask of said sidewall spacer;
   filling non-doped conductive material into the side of said base electrode; and
   carrying out a heating operation to diffuse the impurities of said base electrode via the filled non-doped conductive material to said semiconductor substrate.

7. A method as set forth in claim 6, wherein said sidewall spacer forming step comprises the steps of:
   etching said fourth insulating layer with a mask of said base electrode and said third and fourth insulating layers;
   forming a sixth insulating layer thereon; and
   etching back said sixth insulating layer.

8. A method as set forth in claim 4, wherein said base region forming step comprises the steps of:
   forming a seventh insulating layer on said semiconductor substrate;
   doping impurities into said seventh insulating layer;
   form an eighth insulating layer on said seventh insulating layer; and
   performing a heat operation upon the impurities within said seventh insulating layer, to thereby diffuse the impurities into said semiconductor substrate.

* * * * *